(12) United States Patent
Levinson

(10) Patent No.: US 6,214,427 B1
(45) Date of Patent: Apr. 10, 2001

(54) METHOD OF MAKING AN ELECTRONIC DEVICE HAVING A SINGLE CRYSTAL SUBSTRATE FORMED BY SOLID STATE CRYSTAL CONVERSION

(75) Inventor: Lionel Monty Levinson, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/141,711

(22) Filed: Aug. 28, 1998

(51) Int. Cl.$^7$ ............................... C30B 1/02; H01L 21/78

(52) U.S. Cl. ................................ 428/43; 117/4; 117/7; 117/950; 438/460

(58) Field of Search .................. 117/4, 7, 9, 10, 117/950; 438/22, 42, 48, 57, 77, 460; 428/620, 43

(56) References Cited

U.S. PATENT DOCUMENTS

| | | | |
|---|---|---|---|
| 3,026,210 | 3/1962 | Coble ..................... | 106/3.9 |
| 4,147,584 | * 4/1979 | Garrison et al. ............. | 117/9 |
| 4,148,050 | * 4/1979 | Maier, Jr. .................. | 257/436 |
| 4,150,317 | 4/1979 | Laska et al. ............... | 313/221 |
| 4,280,273 | 7/1981 | Vincent ................... | 438/28 |
| 4,285,732 | 8/1981 | Charles et al. .............. | 501/101 |
| 4,335,501 | 6/1982 | Wickenden et al. .......... | 438/28 |
| 4,636,647 | 1/1987 | Nishizawa ................. | 250/551 |
| 4,943,470 | 7/1990 | Shiromizu et al. ........... | 428/209 |
| 5,427,051 | 6/1995 | Maxwell et al. ............. | 117/4 |
| 5,451,553 | 9/1995 | Scott et al. ................ | 501/86 |
| 5,487,353 | 1/1996 | Scott et al. ................ | 117/4 |
| 5,540,182 | 7/1996 | Levinson et al. ............ | 117/4 |
| 5,549,746 | 8/1996 | Scott et al. ................ | 117/4 |

(List continued on next page.)

OTHER PUBLICATIONS

Shuji Nakamura, GaN–Based Blue/Green Semiconductor Laser, 3 IEEE J. of Selected Topics in Quantum Electronics 435–442 (1997).

Shuji Nakamura, A Bright Future for Blue/Green LEDs, IEEE Circuits and Devices (May, 1995) 19–23.

Nichia Surpasses 10,000 Hours, Announces Blue Laser Prototyping Plans, 3 Compound Semiconductor (Nov./Dec., 1997): 4–6.

Shuji Nakamura and Gerhard Fasol, *The Blue Laser Diode*, 1–77, 216–221 (1997).

*Primary Examiner*—Robert Kunemund
*Assistant Examiner*—Donald L Champagne
(74) *Attorney, Agent, or Firm*—Toan B. Vo; Noreen C. Johnson

(57) ABSTRACT

A method of making an electronic device, according to an exemplary embodiment of the invention, comprises the steps of: forming a polycrystalline substrate in a desired shape; converting the polycrystalline substrate into a single crystal substrate using a solid state crystal conversion process; and forming an electronic element on the substrate. Typically, alumina is formed in the shape of a wafer, sintered to form a densified polycrystalline alumina wafer, and heated to a temperature between the melting point of alumina and one-half the melting point of alumina to convert the densified polycrystalline alumina wafer into a sapphire wafer. A light-emitting diode or other electronic device, such as a laser diode, a high frequency microwave device, or an optoelectronic detector, can be formed on the wafer by depositing layers of semiconductor material on the wafer. The solid state crystal conversion process provides several advantages in forming electronic devices. For example, the cost of the single crystal substrate is significantly reduced since crystal growing from a melt is not required. Also, less processing is required after the crystal is formed, since the precursor polycrystalline substrate can be formed to near net shape. In addition, the polycrystalline substrate can be made in many shapes, in contrast to the shapes possible when growing a crystal from a melt.

32 Claims, 3 Drawing Sheets

U.S. PATENT DOCUMENTS

| | | | |
|---|---|---|---|
| 5,641,975 | * | 6/1997 | Agarwal et al. ......................... 257/76 |
| 5,700,713 | | 12/1997 | Yamazaki et al. ...................... 438/25 |
| 5,780,873 | | 7/1998 | Itaya et al. ............................. 257/95 |
| 5,787,104 | * | 7/1998 | Kamiyama et al. .................... 372/43 |
| 5,814,532 | * | 9/1998 | Ichihara ................................. 438/33 |
| 5,821,568 | * | 10/1998 | Morita et al. .......................... 257/94 |

* cited by examiner

METHOD OF MAKING AN ELECTRONIC DEVICE HAVING A SINGLE CRYSTAL SUBSTRATE FORMED BY SOLID STATE CRYSTAL CONVERSION

BACKGROUND

1. Field of the Invention

The present invention relates generally to electronic devices such as light emitting diodes (LEDs), and more particularly to a method of making an electronic device having a single crystal substrate formed from a polycrystalline material.

2. Description of the Related Art

LEDs, laser diodes, and other electronic devices are typically manufactured by depositing various layers of semiconductor materials on a substrate. A know group of semiconductor materials which is useful in forming light-emitting devices is the gallium nitride (GaN) system. The gallium nitride system refers to semiconductor materials comprising one or more of the group III nitrides, GaN, AlN, and InN. The GaN system allows various wavelengths of light, particularly the shorter wavelengths, to be produced based on the relative amounts of GaN, AlN, and InN in the composition.

Gallium nitride-based semiconductor devices are commonly formed on a substrate comprising sapphire, a single crystal alumina ($Al_2O_3$). Typically, the sapphire substrate is produced by growing a single alumina crystal from molten alumina, and subsequently cutting the sapphire body in the shape of a thin wafer. However, the process of growing a sapphire crystal from a melt is relatively expensive due to the need to carefully control the growing conditions. In addition, the resulting crystal typically must be cut with a diamond saw, ground, and polished into the shape of a wafer. In addition to being expensive, this process limits the types of shapes which can be produced.

It would be desirable, therefore, to have a process for forming a sapphire substrate which decreased the amount of cutting, grinding and polishing required, thereby decreasing the cost of the substrate, and which could be used to form substrates of a variety of shapes useful for different electronic devices.

SUMMARY

A method of making an electronic device, according to an exemplary embodiment of the invention, comprises the steps of: forming a polycrystalline substrate in a desired shape; converting the polycrystalline substrate into a single crystal substrate using a solid state crystal conversion process; and forming an electronic element on the substrate.

According to a preferred embodiment, alumina is formed in the shape of a wafer, sintered to form a densified polycrystalline alumina wafer, and heated to a temperature between the melting point of alumina and one-half the melting point of alumina to convert the densified polycrystalline alumina wafer into a sapphire wafer. A light-emitting diode or other electronic device, such as a laser diode, a high frequency microwave device, or an optoelectronic detector, can be formed on the wafer by depositing layers of semiconductor material on the wafer.

The method provides several advantages in forming electronic devices. For example, the cost of the single crystal substrate is significantly reduced since crystal growing from a melt is unnecessary. Also, less processing is required after the crystal is formed, since the precursor polycrystalline substrate can be formed to near net shape. In addition, the polycrystalline substrate can be formed into many shapes, in contrast to the limited shapes possible when growing a crystal from a melt.

BRIEF DESCRIPTION OF THE DRAWINGS

Other features and advantages of the invention will be apparent from the following detailed description and the accompanying drawings, in which.

DETAILED DESCRIPTION OF THE PREFERRED EMBODIMENTS

Figure 1:
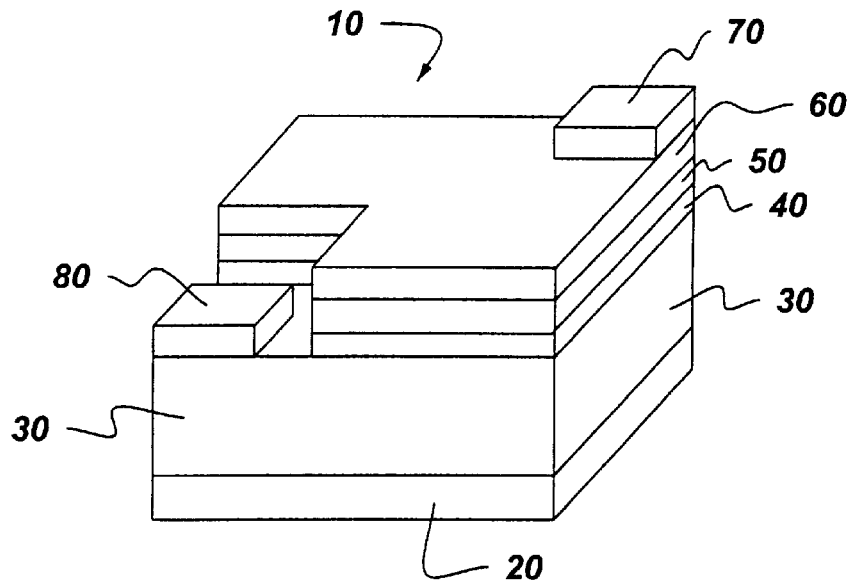
FIG. 1 illustrates an LED according to a first embodiment of the invention.

FIG. 1 illustrates an electronic device 10 according to one embodiment of the invention. The exemplary electronic device 10 is an LED which includes a substrate 20, an n-type GaN layer 30, a layer 40 of InGaN which may form a single or multiple quantum well, a p-type AlGaN layer 50, a p-type GaN layer 60, a positive contact 70, and a negative contact 80. The various semiconductor layers 30, 40, 50, and 60 are typically deposited on one another by chemical vapor deposition (CVD). Although an LED is shown in FIG. 1 as an example, the invention encompasses other electronic devices which include a single crystal substrate and an electronic element fixed to or deposited on the substrate, such as laser diodes, high frequency microwave emitters, and optoelectronic detectors. In general, each layer may comprise $In_xGa_yAl_{(1-x-y)}N$, where $0 \leq x \leq 1$ and $0 \leq y \leq 1$. In addition, semiconductor materials other than GaN can be used, such as gallium arsenide (GaAs) and its alloys, silicon, and silicon carbide (SiC). Other suitable methods of forming semiconductor devices include liquid phase epitaxy, physical vapor deposition (PVD), sputtering, evaporation, and molecular beam epitaxy.

Referring again to FIG. 1, the substrate 20 typically comprises a single crystal material. The single crystal material is formed by converting a polycrystalline material into a single crystal using a solid state crystal conversion process. For electronic devices using the GaN system, sapphire (single crystal alumina, $Al_2O_3$) is a preferred substrate due to its low cost and refractory nature. Although the following discussion relates primarily to sapphire substrates, the invention is not limited to sapphire, but may encompass solid state crystal conversion of other polycrystalline materials. "Substrate" as used herein, refers to a material of any shape upon which can be formed or deposited other materials to produce an electronic device.

The polycrystalline substrate can be formed using conventional ceramic processing methods which are known in the art. For example, a ceramic powder may be combined with an organic binder and die pressed into the desired shape. Other methods for forming the polycrystalline substrate include casting, extrusion, and injection molding. One example of a suitable ceramic powder for producing sapphire is Baikowski CR-10, a relatively pure particulate alumina, primarily alpha alumina. Typically, magnesia is added to the alumina powder in an amount of about 500–700 wppm to inhibit grain growth. The binder can be removed in a de-bindering step in which heat is applied to the substrate to pyrolize the binder, leaving a porous structure, commonly referred to as a bisque-fired part. Preferably, the bisque-fired part comprises more than 99% by weight alumina, typically greater than 99.9% by weight alumina. The bisque-fired part may have a pore volume ranging from about 15–70%, typically 50–60%, for example.

The de-bindering step which produces the bisque-fired part is followed by a sintering step, in which the substrate is heated, typically for several hours to tens of hours, and the density of the substrate is increased substantially, leaving a dense polycrystalline material, e.g. a dense polycrystalline alumina. Sintering can be accomplished, for example, by heating the substrate to a temperature ranging from 1700°–1980° C., preferably 1800°–1900° C., in a hydrogen-containing atmosphere having a dew point lower than 20° C. Typically, the dew point of hydrogen ranges from about –10° to –110° C. Sintering can also take place in other furnace atmospheres, such as He, $H_2$, and $N_2$ mixtures, or a vacuum.

Typically, the bisque-fired alumina part is sintered to a density greater than 3.90 g/cm$^3$, preferably greater than 3.97 g/cm$^3$, as the residual porosity can impede the conversion to sapphire. The bisque-fired part is preferably free of impurities of a type and amount that would prevent the conversion of the sintered polycrystalline substrate to a single crystal substrate. When sintered, the bisque-fired alumina part typically produces a polycrystalline alumina ("PCA") material having an equiaxed grain structure with an average grain size less than 100 μm and preferably less than 70 μm. By grain size is meant the average dimension of a grain as measured by the well known linear intercept technique described in ASTM E 112-88.

The above-described methods and other methods of forming a dense polycrystalline material are known in the art. See, for example, James S. Reed, Introduction to the Principles of Ceramic Processing (1988), and U.S. Pat. Nos. 3,026,210; 4,150,317; and 4,285,732. Suitable polycrystalline materials are also available commercially, such as Lucalox® PCA available from the General Electric Company in Cleveland, Ohio.

A typical trace impurity analysis for a sintered polycrystalline alumina formed by the process described above is given in the table below. The 180 wppm (weight parts per million) concentration of magnesium (Mg) is equivalent to about 300 wppm magnesium oxide (MgO, magnesia).

| Trace Element | Si | Fe | Ca | Mg | K | Na | Li | Mo | Cr | Cu |
|---|---|---|---|---|---|---|---|---|---|---|
| wppm | 50 | 4 | 7 | 180 | 50 | 80 | <1 | 10 | 2 | 4 |

Because the magnesia level in polycrystalline alumina prepared as described above commonly ranges from 300–400 wppm, steps are typically taken to lower the magnesia level to below 100 wppm, preferably below 50 wppm. As is known in the art, magnesia can be driven out of a PCA body, for example, by heating the body in a vacuum, dry hydrogen, or an inert gas atmosphere to a temperature above 1600° C. To obtain a material with a suitable amount of magnesia, the PCA can be heated in an electric resistance furnace to a temperature of 1880° C. for approximately nine hours in an atmosphere of dry hydrogen having a dew point below 0° C., for example. The PCA material resulting from the heat treatment typically has a magnesia content of about 50 wppm.

The polycrystalline substrate is converted to a single crystal substrate by a solid state crystal conversion method. By solid state process is meant that the conversion of the polycrystalline substrate to a single crystal occurs at a temperature sufficiently below the melting temperature of the substrate material such that melting of the polycrystalline material is not required. The solid state crystal conversion process results in a single crystal material. A single crystal material may actually include a small number of crystals, rather than just one. Typically the crystals making up the single crystal material are large compared with the size of the electronic devices being formed. That is, many devices can be made from a single crystal, and any grain boundaries which exist affect the yield only insignificantly, e.g. <1%.

Solid state crystal conversion of the polycrystalline material into a single crystal material can be achieved by heating the polycrystalline material to a temperature greater than about one-half the melting point of the material, but below the melting point of the material. In the case of alumina, the substrate is heated to a temperature greater than about 1100° C., but less than 2050° C., the melting point of alumina. To convert low magnesia, dense polycrystalline alumina to sapphire, the polycrystalline alumina can be heated in an electric resistance furnace in flowing dry hydrogen having a dew point of less than 0° C., for example. The conversion to sapphire can be achieved by passing the polycrystalline alumina substrate in a continuous manner through the hot zone of the furnace which typically has a temperature of about 1880° C. The time the substrate spends moving through the hot zone of the furnace typically ranges from 39 hours, depending on the geometry of the substrate.

In another example, the solid state crystal conversion can be achieved by passing the polycrystalline substrate through the furnace hot zone multiple times. Each pass through the furnace can be executed in a continuous manner. The hot zone temperature is typically 1880° C. and the time the substrate spends in the hot zone during one pass may be about three hours, for example.

In another example, the solid state crystal conversion can be carried out with the polycrystalline substrate remaining stationary for about 300 hours in the hot zone of a hydrogen furnace having a dew point of less than about 0° C. and a temperature of about 1700° C. Using the above methods, a polycrystalline alumina substrate is converted to sapphire. Of course, the above described heating schedules are provided as examples, and may be modified depending on the geometry and material of the substrate, as will be recognized by those skilled in the art. Other details of the solid state crystal conversion process are discussed in U.S. Pat. No. 5,451,553, entitled "Solid State Thermal Conversion of Polycrystalline Alumina to Sapphire", which is hereby incorporated by reference.

Fabrication of the single crystal substrate from the bisque-fired part involves three stages, i.e., sintering the substrate to achieve a dense polycrystalline substrate; reducing the magnesia concentration in the dense polycrystalline substrate below a level that impedes conversion to single crystal; and heating the low-magnesia polycrystalline substrate to convert the polycrystalline substrate to a single crystal substrate. In one embodiment of the invention, these three stages are accomplished in multiple heating cycles, i.e., by raising the temperature of the polycrystalline material in separate processes. In another embodiment of the invention, the three stages are accomplished in a single continuous heating cycle in which all three stages occur without removal of the polycrystalline substrate from the furnace. In the single heating cycle embodiment, there is no clear distinction between the occurrence of the three stages.

Using the above solid state crystal conversion method, it is possible to make, for example, a near net shape sapphire wafer, upon which are to be deposited semiconductor layers, without undergoing a substantial amount of wafer preparation, e.g. cutting, grinding, or polishing. The solid state crystal conversion process in accordance with exemplary embodiments of the invention allows for simple or complex ceramic shapes to be fabricated using standard polycrystalline forming techniques and then converted into a single crystal material without melting the material. Thus, the single crystal substrate maintains the shape of the polycrystalline precursor, enabling the fabrication of a great diversity of shapes, e.g. curved shapes, that are not feasible to fabricate using conventional melt drawing or floating zone techniques. For example, sapphire grown from a melt is typically not formed in the shape of a wafer. Sapphire shapes such as wafers, which are conventionally formed with a substantial amount of cutting and grinding, can be formed to near net shape from alumina powder and subsequently converted to sapphire.

Figure 4:
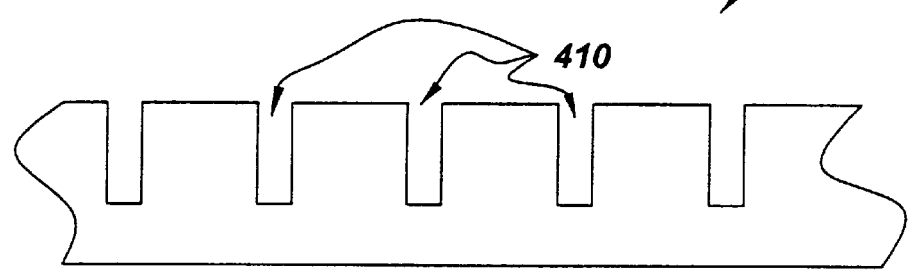
FIG. 4 illustrates a wafer having grooves to facilitate separation of different portions of the wafer.

FIG. 4 shows an example of a shaped wafer which can be formed with conventional ceramic processing techniques and converted to a single crystal wafer by solid state crystal conversion. In FIG. 4, the wafer 400 includes a series of channels or perforations 410, which may be used, for example, to separate different portions of the wafer from each other. This method can facilitate the separation of LED arrays deposited on sapphire wafers into individual LED devices. By contrast, when sapphire is grown from a melt, such shapes are not generally feasible, and extensive processing, e.g. cutting with a diamond saw, may be necessary to obtain the final device. The processing may also result in the loss of a significant amount of material due to sawing and hence fewer useable devices per wafer.

Other substrate shapes which can be made according to exemplary embodiments of the invention include substrates having one or more curved surfaces. For example, a substrate in the shape of a hollow, cylindrical rod can be formed initially as a polycrystalline material, and subsequently converted to a single crystal material such as sapphire by solid state crystal conversion. The rod-shaped substrate can form the base of an LED device, for example, which emits light over a larger range of emission angles (e.g. 360°) than conventional flat LED devices. In general, the methods, such as chemical vapor deposition, used to deposit the active layers, such as GaN, on the substrate can be adapted to form layers on curved surfaces.

Figure 8:
FIG. 8 illustrates a substrate and semiconductor layer having a preformed curvature.

Another example of a substrate having a curved surface is shown in FIG. 8. On the substrate 810, which is typically sapphire, is deposited a layer 820 of, for example, a semiconductor material such as GaN. The substrate 810 has a slight curvature, which is taken by layer 820 deposited on the substrate 810. The preformed curvature in the substrate is provided to relieve strain produced by different thermal expansion coefficients of the substrate 810 and the layer 820. For example, during physical vapor deposition of a GaN layer on a sapphire substrate, the temperature of the materials may be from 700°–1000° C. When the sapphire substrate and GaN layer cool to room temperature, they shrink by different amounts. The differential shrinkage can cause the device to warp. Thus, by providing a preformed, curved substrate, the differential shrinkage can be compensated such that the cooled device is flat.

Single crystal materials such as sapphire, produced by solid state crystal conversion, are distinguished from single crystal materials fabricated using melt drawing techniques by the combination of a random pore arrangement and a unique surface topography in the form of undulations having high points at approximately the midpoint of where each polycrystalline grain was located prior to the conversion and depressed areas corresponding to where the grain boundaries were located prior to conversion. By contrast, single crystal materials such as sapphire fabricated by many melt drawing techniques typically exhibit a linear arrangement of porosity resulting from bubbles produced during the drawing process.

Figure 9:
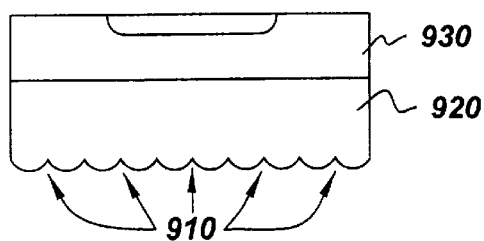
FIG. 9 illustrates an exemplary LED device in which the substrate has slight undulations.

The undulations can be advantageously utilized, for example, to provide diffuse scattering for emitted photons in an LED, which improves the external quantum efficiency of the LED. For example, as shown in FIG. 9, the undulations 910 are located on the side of the substrate 920 remote from the n-layer 930 to provide diffuse scattering of photons.

Additional methods for converting polycrystalline materials to single crystal materials will now be described.

According to another embodiment of the invention, a dopant is included in the polycrystalline substrate to enhance the solid state crystal conversion process. The polycrystalline substrate is doped to a selected concentration with a conversion-enhancing dopant and is then heated at a temperature that is less than the melting temperature, but greater than about one-half the melting temperature of the polycrystalline material, as described above. According to this embodiment, the dopant is typically applied to the bisque-fired part prior to sintering. As used herein, "conversion-enhancing dopant" refers to a dopant that, when introduced into the polycrystalline substrate at a concentration as described herein, reduces the time necessary to effect the solid state conversion of the polycrystalline substrate to a single crystal material.

The selected concentration of the dopant is preferably less than the solid solubility level of the dopant in the polycrystalline material. The selected concentration of the conversion-enhancing dopant is thus less than a concentration that will result in the formation of a second crystalline phase in the polycrystalline material. The dopant is typically dispersed in the polycrystalline material such that the concentration of the dopant is substantially homogeneous throughout the polycrystalline material.

Based on dopant levels and dopant types that have been investigated to date, it has been observed that the conversion rate generally increases as the concentration of the dopant is increased. For example, a PCA material doped at a selected concentration with chromium, gallium, or titanium has been shown to convert to sapphire in less time than a similarly-sized undoped PCA material.

Conversion-enhancing dopants for alumina typically comprise cations having a +3 valence that exhibit appreciable solid solubility in alumina. "Appreciable solid solubility" refers to a material that, when mixed with alumina at a level below the material's solid solubility limit results in a PCA-to-sapphire conversion rate of practical significance, e.g. on the order of centimeters per hour. The solid solubility levels in alumina for the conversion-enhancing dopants chromium, titanium, and gallium are on the order of 10–500 wppm. Other cations that may, at a selected concentration, exhibit conversion enhancing properties in alumina include cerium, samarium, lanthanum and vanadium.

The bisque-fired part may be doped, for example, by immersing the bisque-fired part in a liquid solution of the selected conversion-enhancing dopant. The doping solution typically comprises deionized water with dopant dissolved therein to provide a predetermined concentration of the doping ion. Infiltration of the dopant into the material of the bisque-fired part can be further induced, for example, by disposing the bisque-fired part, along with the doping solution in which it is immersed, in a vacuum chamber and drawing a selected vacuum on the chamber for a selected time. After immersion and the exposure to the vacuum chamber, the doped bisque-fired part is removed and allowed to dry, typically in air, after which it is heated in a furnace to effect the solid state conversion process.

According to another embodiment of the invention, the dopant is introduced into the raw materials, e.g. ceramic powder, used to produce the polycrystalline body.

The bisque-fired part doped to have the selected concentration of conversion-enhancing dopant is then heated to a temperature greater than one-half of the melting point but less than the melting point of the material of the bisque fired part. No bulk melting of the material is observed during the process of converting the polycrystalline material to a signal crystal material, and growth of the single crystal structure is typically initiated from more than one site on the substrate. Details of the solid state thermal conversion process are contained in the above-referenced U.S. Pat. No. 5,451,553, entitled "Solid State Thermal Conversion of Polycrystalline Alumina to Sapphire".

According to another embodiment of the invention, the doping process is varied to make a composite material, that is, a body having both single crystal and polycrystalline regions. Such a composite body can be formed by doping selected portions of a bisque-fired part, and then heating the part as described above to convert the doped portions to a single crystal material. In this way, the final product has distinct regions of single crystal and polycrystalline material.

Alternately, the composite material can be formed by selectively doping a first portion of the bisque-fired part with a first concentration of a conversion-enhancing dopant and doping a second portion of the bisque-fired part with a second concentration of the conversion enhancing dopant. The second concentration is greater than the solid solubility limit of the conversion enhancing dopant so as to cause the precipitation of a second phase along the grain boundaries of the second portion of the bisque-fired part. The second portion of the bisque-fired part does not convert due to the presence of the second phase at the boundary at this portion of the part. The first portion converts to a single crystal.

The composite material can also be formed by selectively doping a first portion of the bisque-fired part with a conversion-enhancing dopant and doping a second portion of the bisque-fired part with a conversion-retarding dopant. One example of a conversion-retarding dopant is yttrium and its compounds.

Figure 2:
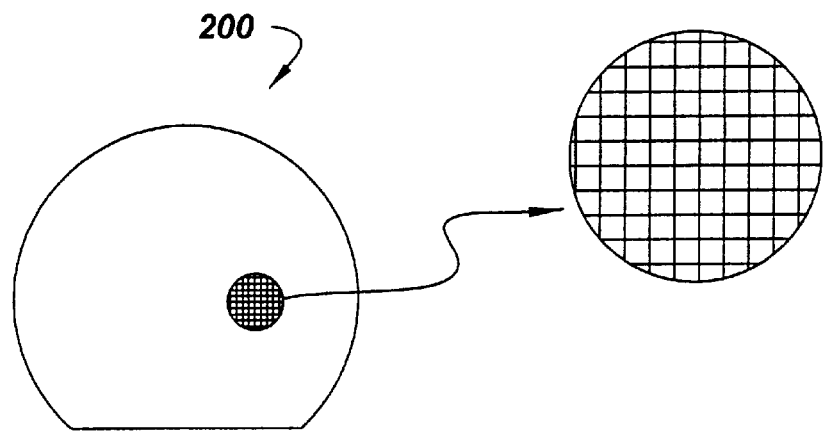
FIG. 2 illustrates a wafer having polycrystalline and single crystal regions, according to another embodiment of the invention.

FIG. 2 illustrates a wafer 200 which includes first regions of polycrystalline material and second regions of single crystal material. In FIG. 2, the grid lines of polycrystalline material may be formed by any of the three techniques discussed above, i.e., absence of conversion-enhancing dopant, excess concentration (i.e. >solid solubility limit) of conversion-enhancing dopant, or application of conversion-retarding dopant. Conversion-enhancing dopant is applied in the spaces between the grid lines. Upon application of the solid state crystal conversion heating cycle, a polycrystalline alumina wafer will have selected regions of sapphire located between a polycrystalline grid. The polycrystalline material typically is easier to fracture than a single crystal of the same material. Hence, the polycrystalline grid lines preferentially fracture, which facilitates separation of the substrate into individual devices.

Figure 3:
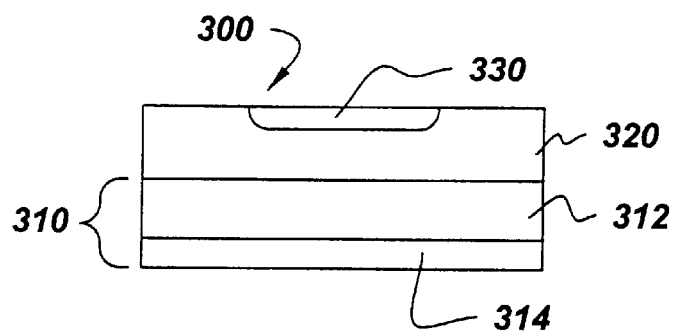
FIG. 3 illustrates an LED having a substrate with both polycrystalline and single crystal regions according to a further embodiment of the invention.

FIG. 3 illustrates another embodiment of the invention, in which a first portion of the substrate comprises a polycrystalline material, and a second portion of the substrate comprises a single crystal material. In FIG. 3, an LED 300 is depicted which includes a substrate 310, an n-layer 320, and a p-layer 330. The substrate 310 comprises a single crystal portion 312, and a polycrystalline portion 314. The polycrystalline portion 314 provides diffuse scattering for photons emitted from the pn junction, which improves the external quantum efficiency of the LED. The substrate 310 can be formed with a solid state crystal conversion process in which the single crystal layer 312 is doped with a conversion-enhancing dopant, and the polycrystalline layer is 314 is formed by any of the three techniques discussed above, i.e., absence of conversion-enhancing dopant, high concentration of conversion-enhancing dopant, or application of conversion-retarding dopant.

Other details of this process are described in U.S. Pat. No. 5,487,353, which is hereby incorporated by reference.

According to another embodiment of the invention, the solid state crystal conversion process can be enhanced by providing a surface topography to the polycrystalline substrate. "Topography" refers to the surface features or surface configuration of the polycrystalline substrate, including, but not limited to, protrusions from the surface and depressions into the surface, and the orientation of such surface features on the polycrystalline substrate.

Figure 5:
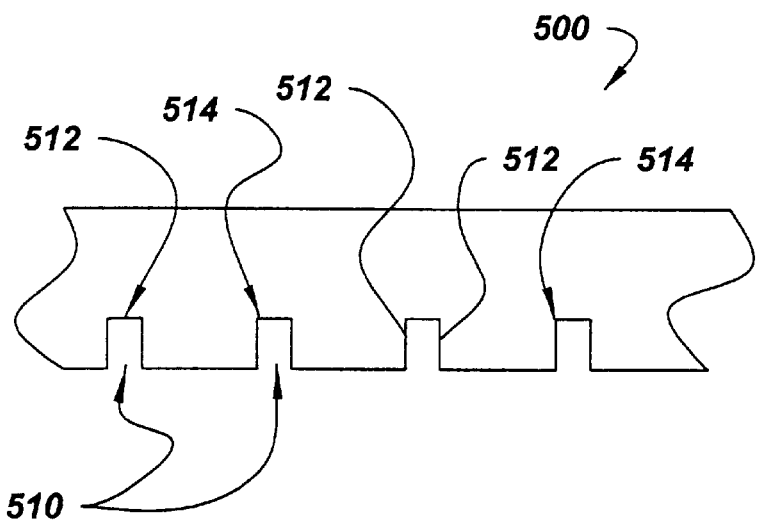
FIG. 5 illustrates a substrate having a topography which facilitates solid state crystal conversion of the wafer.

FIG. 5 illustrates an article 500 having surface topography comprising grooves 510. The grooves 510 have sidewalls 512 which intersect at respective junctions 514 to form an angle between adjoining sidewalls. The angle between sidewalls 512 typically forms a relatively sharp corner, with little or no curvature at the junction 514. For example, the radius of curvature at the junction 514 is typically less than the average grain size in the polycrystalline material. The angle formed at the exterior junction of two sidewalls (i.e., the angle between the surfaces of the sidewalls forming the surface of the polycrystalline substrate) can be acute, right, or obtuse, and is typically in the range of 20° to 160°. For ease of fabrication, right angles are commonly used.

Both the length and the width of the sidewalls 512 are preferably equal to or greater than the average grain size in the polycrystalline substrate 500, and are typically at least five times larger than the average grain size. Sizing the dimensions of surface features to be greater than the average grain size of the polycrystalline material and forming sharp corners at the junctions 514 promotes the conversion of the polycrystalline material to a single crystal material. As shown in FIG. 5, the grooves 510 may be formed on the bottom side of a substrate which may be used, for example, to form LED devices.

The selected surface topography of the polycrystalline substrate 500 may also comprise protrusions formed on the surface of the polycrystalline substrate which have sidewalls intersecting at sharp corners. Similarly, the dimensions of the sidewalls of the protrusions are greater than the average grain size of the polycrystalline material, typically at least five times larger than the average grain size. Other examples of surface topographies which promote solid state crystal conversion are discussed in U.S. Pat. No. 5,540,182, which is hereby incorporated by reference.

The selected surface topography can be formed on the precursor of the polycrystalline body by casting, pressing, or extruding, for example, or by patterning the polycrystalline substrate after it has been cast, pressed, or extruded. The topography can be formed before or after sintering the polycrystalline substrate. Patterning the polycrystalline substrate after it has been cast, pressed, or extruded is typically carried out by applying a cutting implement to cut or scribe the desired surface features into the polycrystalline substrate. For example, a mechanical device such as a saw or related machining tool, or a non-mechanical cutting device such as a laser, can be used to pattern the polycrystalline substrate.

In accordance with exemplary embodiments of the invention, the polycrystalline substrate having the selected surface topography formed thereon is heated to a temperature not greater than the melting point of the polycrystalline material but greater than about one-half the melting point of the polycrystalline material. No bulk melting of the material is observed during the conversion process, and growth of the single crystal material is typically initiated from more than one location on the body. Specifically, growth of the single crystal material typically initiates from one or more of the junctions in the surface features.

Figure 6:
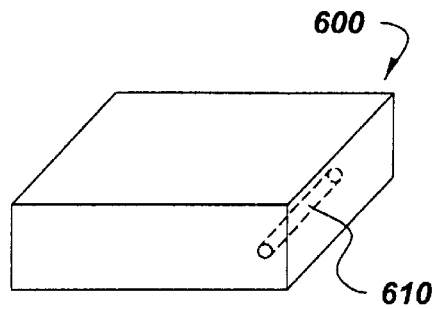
FIG. 6 illustrates a substrate and seed crystal combination which facilitates solid state crystal conversion of the substrate.

FIG. 6 illustrates another embodiment of the invention in which a sapphire fiber 610 is used as a seed crystal to enhance solid state crystal conversion. The sapphire fiber 610 is inserted into a hole drilled in a partly sintered polycrystalline substrate 600 prior to full sintering and conversion of the polycrystalline substrate to a single crystal substrate. The hole can be drilled at different orientations to orient the crystal as desired, which is advantageous because an adjacent GaN layer, for example in an LED, takes its orientation from the sapphire substrate.

The seed crystal is preferably inserted into a partially sintered material, so that during sintering, shrinkage of the material reduces the hole size and provides a snug fit between the seed crystal and the material to be converted. One suitable substrate material is partially sintered Lucalox® alumina available from the General Electric Company. Sapphire seed crystals are commercially available from Saphikon, Inc. of Milford, N.H., for example, or from previously converted sapphire.

The combination of seed crystal and polycrystalline substrate is then sintered in a hydrogen-containing atmosphere having a dew point which is typically less than 20° C. Typically, the dew point of the hydrogen ranges from about −10° to −110° C. Flowing hydrogen is preferred, as is known in the art. The PCA and sapphire seed combination can also be sintered in other furnace atmospheres including He, $H_2$ and $N_2$ mixtures, or in a vacuum. The partially sintered PCA substrate can be sintered at a temperature ranging from about 1700° C. to about 1980° C., and preferably between 1800° C. and 1900° C. in a vacuum or $H_2$.

The resulting structure comprises a PCA body having a relatively uniform grain size with an average grain size typically ranging from about 15–70 $\mu$m preferably between 15–50 $\mu$m. The density is typically greater than 3.90 g/cm³, more typically greater than 3.97 g/cm³. A monolithic joint is commonly produced between the seed crystal and the polycrystalline material to be converted.

After sintering and reducing the magnesia level to a suitable amount, continued heating or thermal cycling converts the seeded PCA structure to sapphire. The polycrystalline alumina is heated to above half the melting temperature but below the melting temperature of the alumina. The polycrystalline substrate may be heated slowly over a period of 15–16 hours from room temperature to 1800° C., holding at 1880° C. for three hours, and then slowly cooling back down to room temperature over a period of 15–16 hours, for example. This process may be repeated if necessary. Of course, heating conditions will vary with the shape and material of the substrate to be converted.

Figure 7:
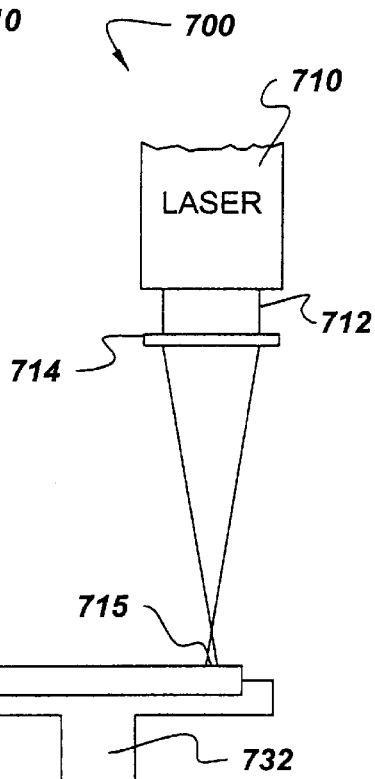
FIG. 7 illustrates an apparatus for localized heating of a polycrystalline substrate to enhance solid state crystal conversion of the substrate.

FIG. 7 illustrates an apparatus 700 employed in carrying out another embodiment of the invention which utilizes localized heating to enhance the solid state crystal conversion process. The localized heating effectively creates an initiation crystal on the polycrystalline substrate. The apparatus 700 comprises a laser 710 emitting a laser beam 712 which is focused by a focusing lens 714 to reduce the beam size and direct the reduced laser beam to one end of a polycrystalline substrate 720 at location 715. The laser 710 may comprise, for example, a 150-watt continuous wave carbon dioxide ($CO_2$) laser which is used as a localized energy source. The diameter of the laser beam 712 exiting the laser 710 may be about 12 mm, for example, and can be focused down to a 1 mm diameter at location 715 with the focusing lens 714 to provide a point heating source.

The point heating source can be used to create a ring heat source by rotating the polycrystalline substrate 720. For example, the substrate 720 can be rotated at a speed of about 200 RPM by a motor 730 which includes a chuck 732 to hold the substrate 720. Other methods of distributing the laser energy are known in the art. For example, the laser beam can be divided and focused at several points on the substrate; more than one laser beam can be employed; or the laser beam can be reflected off a conically-configured reflector in an elliptical cavity to provide a ring-shaped localized heating source.

Typically, the laser power is increased slowly, e.g. over a period of about 45 minutes, to slowly heat the polycrystalline substrate and avoid cracking due to thermal shock. The final maximum power can be 120 watts, for example, which typically raises the outer surface temperature of the polycrystalline substrate at location 715 to a temperature of about 1800° C. The laser beam can be maintained as a ring or distributed source at a power of 120 watts during the conversion of the entire polycrystalline substrate to a single crystal material. To further reduce the chance of thermally shocking the polycrystalline substrate, the laser can be slowly translated radially relative to the polycrystalline substrate.

After maintaining the heated region (715) of the polycrystalline substrate at a temperature above 1800° C. for about one-half to one hour, the laser power can be slowly reduced to zero over a period of about 45 minutes. The entire PCA substrate can be converted to sapphire, even though the laser beam is directed at only a small point near the outer periphery of the substrate.

Other types of heating sources, such as heat lamps, plasma torches, RF heated susceptors, microwave sources, RF heating sources, electron beams, and molten alumina can be used, as described in U.S. Pat. No. 5,427,051, which is hereby incorporated by reference.

Other embodiments of the invention will be apparent to those skilled in the art from a consideration of this specification or practice of the invention disclosed herein. It is intended that the specification and examples be considered as exemplary only, with the scope and spirit of the invention being defined by the following claims.

What is claimed is:

1. A method of making an electronic device comprising the steps of:
    forming a polycrystalline substrate in a desired shape, the polycrystalline substrate having at least one groove located at an edge of the electronic device;
    converting the polycrystalline substrate into a single crystal substrate using a solid state crystal conversion process; and
    forming an electronic element on the substrate, wherein the at least one groove facilitates separation of a first portion of the substrate from a second portion of the substrate at the edge of the electronic device, wherein the desired shape is a wafer having a curvature to relieve strain which results from different materials of the substrate and a layer deposited on the substrate.

2. The method of claim 1, wherein the electronic device is a light emitting diode.

3. The method of claim 1, wherein the electronic device is a laser diode.

4. The method of claim 1, wherein the electronic device is a microwave generator.

5. The method of claim 1, wherein the electronic device is an optoelectronic detector.

6. The method of claim 1, wherein the polycrystalline substrate comprises alumina, and the single crystal substrate comprises sapphire.

7. The method of claim 1, wherein the electronic element is fixed on the substrate by depositing at least one layer comprising $In_xGa_yAl_{(1-x-y)}N$, wherein $0 \leq x \leq 1$ and $0 \leq y \leq 1$.

8. The method of claim 1, wherein the forming step comprises at least one of pressing, casting, extruding, and injection molding a ceramic powder.

9. The method of claim 1, wherein the converting step is carried out by heating the polycrystalline substrate to a temperature less than the melting point but greater than one-half the melting point of the material of the polycrystalline substrate.

10. The method of claim 1, further comprising the step of forming a surface topography on the polycrystalline substrate to enhance the solid state crystal conversion process.

11. The method of claim 1, further comprising the step of doping at least, a portion of the polycrystalline substrate with a conversion-enhancing dopant to enhance the solid state crystal conversion process.

12. A method of making an electronic device comprising the steps of:
    forming a polycrystalline substrate in a desired shape;
    converting the polycrystalline substrate into a single crystal substrate using a solid state crystal conversion process;
    forming an electronic element on the substrate;
    doping at least a portion of the polycrystalline substrate with a conversion-enhancing dopant to enhance the solid state crystal conversion process; and
    doping a second portion of the polycrystalline substrate with at least one of: a conversion-retarding dopant and a second conversion enhancing dopant at a concentration greater than a solid solubility limit of the second conversion enhancing dopant, wherein the second conversion enhancing dopant may be the same as the conversion enhancing dopant, to retard the solid state crystal conversion process.

13. The method of claim 12, wherein the second portion forms a grid on the polycrystalline substrate.

14. The method of claim 12, wherein the second portion occupies an outer layer of the polycrystalline substrate such that after solid state crystal conversion, the outer layer acts as a diffuse reflector.

15. A method of making an electronic device comprising the steps of:
    forming a polycrystalline substrate in a desired shape;
    converting the polycrystalline substrate into a single crystal substrate using a solid state crystal conversion process;
    forming an electronic element on the substrate; and
    doping at least a portion of the polycrystalline substrate with at least one of a conversion retarding dopant and a conversion enhancing dopant at a concentration greater than a solid solubility limit of t he conversion enhancing dopant to retard the solid state crystal conversion process.

16. The method of claim 15, further comprising the step of doping a second portion of the polycrystalline substrate with a second conversion enhancing dopant at a concentration less than a solid solubility limit of the second conversion enhancing dopant, wherein the conversion enhancing dopant and the second conversion enhancing dopant may be the same.

17. The method of claim 1, further comprising the step of fixing a seed crystal to the polycrystalline substrate to enhance the solid state crystal conversion process.

18. The method of claim 17, further comprising the step of selecting an orientation of the seed crystal to control the crystal orientation of the single crystal substrate.

19. The method of claim 17, wherein the step of fixing the seed crystal comprises:
    forming a cavity in the polycrystalline substrate; and
    inserting a seed crystal in the form of a fiber into the cavity.

20. The method of claim 1, further comprising the step of applying energy to a localized region of the polycrystalline substrate to enhance the solid state crystal conversion process.

21. The method of claim 1, wherein the step of forming an electronic element on the substrate comprises depositing at least one semiconductor layer on the single crystal substrate.

22. The single crystal substrate of claim 1, wherein the single crystal substrate has a random distribution of pores.

23. The method of claim 1, wherein the at least one groove has a depth which is at least one half a thickness of the polycrystalline substrate.

24. The method of claim 1, wherein the substrate comprises a plurality of grooves formed in a grid pattern.

25. A method of forming a sapphire wafer comprising the steps of:

forming alumina in the shape of a wafer to be used in fabrication of at least one electronic device;

sintering the alumina to form a densified polycrystalline alumina wafer, the alumina wafer having at least one groove located at an edge of the at least one electronic device;

heating the densified polycrystalline alumina wafer to a temperature between the melting point of alumina and one-half the melting point of alumina to convert the densified polycrystalline alumina wafer into a sapphire wafer, wherein the at least one groove facilitates separation of a first portion of the sapphire wafer from a second portion of the sapphire wafer at the edge of the at least one electronic device, further comprising the step of forming the alumina wafer to have a curvature to relieve strain which results from different materials of the sapphire wafer and a layer deposited on the sapphire wafer.

26. The method of claim 25, wherein the at least one groove has a depth which is at least one half a thickness of the alumina wafer.

27. The method of claim 25, wherein the alumina wafer comprises a plurality of grooves in the alumina wafer, and the grooves form a grid pattern.

28. A single crystal wafer for fabrication of a plurality of electronic devices, the single crystal wafer made by:

forming a polycrystalline body in the shape of a wafer for fabrication of a plurality of electronic devices, the polycrystalline body having a curvature in a surface of the body and at least one groove, the curvature being in a direction so as to relieve strain in a layer of different material after the layer is deposited on the single crystal wafer, the at least one groove having a depth which is greater than one half a thickness of the polycrystalline body; and converting the polycrystalline body into the single crystal wafer by solid state crystal conversion.

29. The single crystal wafer of claim 28, wherein the at least one groove comprises a plurality of grooves in a grid pattern.

30. The single crystal wafer of claim 28, wherein the single crystal wafer has a random distribution of pores and a surface topography in the form of slight undulations and depressed areas.

31. The method of claim 1 wherein the strain to be relieved is produced by different thermal expansion coefficients of the substrate and the layer deposited on the substrate.

32. The method of claim 25 wherein the strain to be relieved is produced by different thermal expansion coefficients of the sapphire wafer and the layer deposited on the sapphire wafer.

* * * * *